(12) United States Patent
Koosau et al.

(10) Patent No.: US 12,185,433 B2
(45) Date of Patent: Dec. 31, 2024

(54) HIGH-TEMPERATURE SUBSTRATE SUPPORT ASSEMBLY WITH FAILURE PROTECTION

(71) Applicant: Applied Materials, Inc., Santa Clara, CA (US)

(72) Inventors: Denis Martin Koosau, Pleasanton, CA (US); Suresh Gupta, Union City, CA (US); Martin Perez-Guzman, Milpitas, CA (US); Ashish Goel, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/197,657

(22) Filed: May 15, 2023

(65) Prior Publication Data

US 2023/0377930 A1 Nov. 23, 2023

(30) Foreign Application Priority Data

May 17, 2022 (IN) .............................. 202241028214

(51) Int. Cl.
*H05B 3/26* (2006.01)
*H01L 21/67* (2006.01)
*H01L 21/683* (2006.01)

(52) U.S. Cl.
CPC ....... *H05B 3/267* (2013.01); *H01L 21/67109* (2013.01); *H01L 21/6833* (2013.01); *H05B 3/265* (2013.01)

(58) Field of Classification Search
CPC ......... H01L 21/67103; H01L 21/67109; H01L 21/6831; H01L 21/6833; H05B 3/265; H05B 3/267; H05B 3/283

USPC .......................................................... 219/531
See application file for complete search history.

(56) References Cited

U.S. PATENT DOCUMENTS

| | | | | |
|---|---|---|---|---|
| 5,567,267 A | * | 10/1996 | Kazama | H01J 37/32 118/724 |
| 5,688,331 A | * | 11/1997 | Aruga | C23C 16/46 118/728 |
| 6,310,755 B1 | * | 10/2001 | Kholodenko | C04B 35/565 361/115 |
| 6,365,879 B1 | * | 4/2002 | Kuibira | H01L 21/67103 219/544 |
| 10,490,435 B2 | | 11/2019 | Willwerth et al. | |
| 2005/0103444 A1 | | 5/2005 | Brcka | |

(Continued)

OTHER PUBLICATIONS

International Search Report and Written Opinion for International application No. PCT/US2023/022382 mailed Sep. 6, 2023, 10 pages.

*Primary Examiner* — Sang Y Paik
(74) *Attorney, Agent, or Firm* — LOWENSTEIN SANDLER LLP (57) ABSTRACT

A substrate support assembly includes a plate structure and an insulator structure. The plate structure includes an upper plate and a lower plate. The lower plate includes a lower plate structure surface. The insulator structure is disposed beneath the plate structure. The insulator structure includes a lower insulator structure surface and an upper insulator structure surface. A first portion of the upper insulator structure surface is recessed with respect to a second portion of the upper insulator structure surface. The first portion of the upper insulator structure surface forms an interior volume with the lower plate structure surface.

18 Claims, 6 Drawing Sheets

(56) References Cited

U.S. PATENT DOCUMENTS

| | | |
|---|---|---|
| 2017/0140970 A1 | 5/2017 | Boyd, Jr. |
| 2017/0236693 A1 | 8/2017 | Kobayashi |
| 2019/0043699 A1 | 2/2019 | Cho |
| 2019/0051551 A1 | 2/2019 | Lin |
| 2020/0035535 A1* | 1/2020 | Parkhe .............. H01L 21/67103 |
| 2021/0175103 A1 | 6/2021 | Madananth et al. |
| 2021/0358726 A1* | 11/2021 | Ko .................... H01L 21/67253 |
| 2022/0013328 A1* | 1/2022 | Kim .................. H01J 37/32724 |
| 2022/0076920 A1 | 3/2022 | Paul et al. |
| 2022/0127723 A1 | 4/2022 | Li et al. |

\* cited by examiner

HIGH-TEMPERATURE SUBSTRATE SUPPORT ASSEMBLY WITH FAILURE PROTECTION

RELATED APPLICATIONS

This patent application claims the benefit under 35 U.S.C. § 119 (e) of India Provisional Application No. 202241028214, filed 17 May 2022, which is incorporated by reference herein in its entirety. This patent application is related to co-pending U.S. application Ser. No. 18/197,658 filed May 15, 2023.

TECHNICAL FIELD

The instant specification relates to a substrate support apparatus for substrate processing operations. Specifically, the instant specification relates to a high temperature substrate support apparatus for high temperature processing operations, including protection against failure conditions.

BACKGROUND

Chambers are used in many types of processing systems. Examples of chambers include etch chambers, deposition chambers, anneal chambers, and the like. Typically, a substrate, such as a semiconductor wafer, is placed on a substrate support within the chamber and conditions in the chamber are set and maintained to process the substrate. The properties of the substrate support have an effect on the properties of the completed substrate.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In some aspects of the present disclosure, a substrate support assembly includes a plate structure and an insulator structure. The plate structure includes an upper plate and a lower plate. The lower plate includes a lower plate structure surface. The insulator structure is disposed beneath the plate structure. The insulator structure includes a lower insulator structure surface and an upper insulator structure surface. A first portion of the upper insulator structure surface is recessed with respect to a second portion of the upper insulator structure surface. The first portion of the upper insulator structure surface forms an interior volume with the lower plate structure surface.

In another aspect of the present disclosure, an insulator structure of a substrate support assembly includes a lower insulator structure surface and an upper insulator structure surface. A first portion of the upper insulator structure surface is recessed with respect to a second portion of the upper insulator structure surface.

In another aspect of the present disclosure, a process chamber includes a substrate support assembly. The substrate support assembly includes a puck for supporting the substrate. The puck includes a heating element. The substrate support assembly includes a radio frequency (RF) insulator structure. The RF insulator structure includes a lower insulator structure surface and an upper insulator structure surface. A first portion of the upper insulator structure surface is recessed with respect to a second portion of the upper insulator structure surface.

In another aspect of the present disclosure, a substrate support assembly includes a puck, a power distribution assembly, and an alumina insulator. The puck includes a heating element. The alumina insulator is disposed between the puck and the power distribution assembly. An electrical connection between the heating element and the power distribution assembly includes a terminal and a conical washer.

In another aspect of the present disclosure, a process chamber includes a puck for supporting a substrate, a power distribution assembly, and a ceramic insulator. The puck includes a heating element. The ceramic insulator is disposed between the puck and the power distribution assembly.

In another aspect of the present disclosure, a method includes recessing a first portion of a radio frequency (RF) insulator plate, such that a space is formed between the RF insulator plate and an adjacent component of a process chamber. The method further includes installing an insulator between a heated puck of the process chamber and a power distribution assembly of the process chamber. The insulator reduces heat transfer to the component of the process chamber in an emergency machine off (EMO) condition.

BRIEF DESCRIPTION OF THE DRAWINGS

The present disclosure is illustrated by way of example, and not by way of limitation in the figures of the accompanying drawings.

DETAILED DESCRIPTION

Embodiments of the present disclosure provide a substrate support assembly, including an electrostatic chuck assembly and a radio frequency (RF) insulating plate. In substrate processing systems, electrostatic chuck (ESC) assemblies may be utilized to support and/or secure a substrate for processing. An ESC may include radio frequency (RF) elements, heating elements, chucking elements, etc. An ESC may perform several functions for facilitating substrate processing related to included elements, including substrate temperature control, substrate position control, etc.

In some embodiments, a substrate support assembly includes an ESC puck. The puck may comprise an upper puck plate bonded to a lower puck plate. The puck may include electrodes configured for heating, providing RF radiation, chucking, etc. The puck may be coupled to a cooling plate by a number of fasteners. The cooling plate may be disposed above (e.g., supported by) a base plate, which may be disposed above an insulator plate. In some embodiments, one or more fasteners couple the base plate to the puck. The cooling plate may be supported by the base plate, e.g., facilitated by fasteners coupling the base plate to the puck. In some embodiments, a portion of the base plate may be in contact with the puck, in thermal communication with the puck, or the like. For example, the cooling plate may be nested in the base plate. The insulator plate may be configured to insulate against radio frequency (RF) radiation.

In some embodiments, the substrate support assembly may be configured for high temperature substrate processing, e.g., above 200° C., above 250° C., above 300° C., above 350° C., or the like. In some embodiments, the substrate support assembly may be included in a processing system (e.g., installed in a processing chamber) targeting substrate processing conditions of about 350° C.

In some embodiments, the cooling plate may be constructed of a material with high thermal conductivity, e.g., aluminum. The cooling plate may include one or more channels that may form one or more flow paths for coolant fluid(s). The cooling plate may be configured to have a coolant circulated through one or more channels of the cooling plate. In some embodiments, the base plate may apply a force to the cooling plate to improve thermal contact between the cooling plate and the puck. For example, the base plate may be fastened to the puck at one or more locations, and one or more portions of the cooling plate may be pressed (e.g., by springs or another elastic medium disposed between the cooling plate and the base plate) against the underside of at least a portion of the puck. In another example, fasteners (e.g., threaded fasteners such as bolts that are fastened to threaded inserts that may be embedded within the puck) may secure the cooling plate and/or base plate to the puck.

In some embodiments, disposed beneath the base plate there may be an insulator plate, designed to insulate portions of the system from RF fields. For example, the insulator plate may be composed of a material with a target dielectric constant. In some embodiments, the insulator plate may be composed of a plastic material. In some embodiments, the insulator plate may be composed of a styrene-containing polymer material. In some embodiments, the insulator plate may be composed of one or more thermoset, rigid, optionally translucent thermoplastics. The thermoplastic(s) of the insulator plate may have a target dielectric constant (e.g., up to 2.53 through 500 GHz) with low dissipation factors. In some embodiments, the insulator plate is formed of a thermoset cross-linked polystyrene copolymer. In some embodiments, the insulator plate may be composed of a polyamideimide plastic. In some embodiments, the insulator plate may be composed of a combination of materials, e.g., one or more plastic portions and one or more ceramic (e.g., alumina) portions. In some embodiments, at least one of the materials included in the composition of the insulator plate may not be compatible with high temperatures (e.g., the plastic/polymer material may reach a melting point, a burning point, a glass transition point, or the like, in high temperature processing conditions).

In some embodiments, physical contact between proximate surfaces of the base plate and the insulator plate may be limited. For example, portions of the insulator plate may be recessed (e.g., machined to sit a target distance from the base plate surface). In some embodiments, contact between the base plate and the insulator plate may be maintained around an outer edge of the insulator plate, but not a center portion of an approximately planar surface proximate to the base plate. In some embodiments, contact between the base plate and the insulator plate is maintained at one or more positions of the interface between the base plate and the insulator plate. For example, some portions of the top surface of the insulator plate may be recessed, and some portions may not be recessed. Unrecessed portions of the top surface of the insulator plate may assist in supporting the base plate. The base plate may also be supported by other components, e.g., one or more O-rings or other sealing device, one or more inserts coupled between the base plate and the insulator plate, or the like.

In some embodiments, various components, fluids, or the like may pass through the insulator plate to other components of the substrate support assembly. For example, a coolant fluid may be supplied to the cooling plate through the insulator plate. In some embodiments, a seal is generated between a portion of the insulator plate surface and the base plate surface, e.g., to define a flow path for one or more fluids. In some embodiments, a portion of the insulator plate may not be recessed to generate one or more seals with the base plate. In some embodiments, an insert may be utilized. The insert may generate a seal with the base plate and a seal with the insulator plate. The insert may be made of a different material than the insulator plate and/or the base plate, e.g., a thermally insulating material such as alumina. In some embodiments, multiple channels through the insulator plate may be formed of an insert, may include an inset, etc.

In some embodiments, two areas of the surface of the insulator plate proximate to the base plate may be recessed a different amount. For example, one or more areas near a seal (e.g., a fluid pass-through of the insulator plate) may be recessed less (e.g., there may be less distance between these areas and the proximate surface of the base plate than the distance between an area of the surface of the insulator plate farther from a seal and the base plate) than areas farther from a seal. In some embodiments, one or more locations between the insulator plate and the base plate (e.g., the volume between the insulator plate and the base plate generated by one or more recesses of the insulator plate) may have additional material added, e.g., one or more shims, polyimide films, etc. The added material may be thermally insulating. In some embodiments, a layer of thermally insulated material may be deposited on one area of the recessed region, two or more areas of the recessed region, the entirety of the recessed region, etc.

In some embodiments, various electrical connections may be formed to power components of the puck (e.g., heating electrodes, chucking electrodes, etc.). In some systems, electrical connections and/or components may be damaged when exposed to high temperatures. For example, the temperatures attained in high temperature processing (e.g., the temperature of the puck of a substrate support assembly) may damage electrical components. One or more thermal insulators may be utilized to protect delicate electrical components (e.g., electrical components that may be damaged by exposure to elevated temperatures). In some embodiments, a distributing assembly (e.g., alternating current (AC) distribution assembly) may supply electrical power to various components of the puck, e.g., chucking electrodes, heating electrodes arranged in one or more zones, etc. A thermal insulator and one or more electrical pass-throughs (e.g., a thermal insulator which includes one or more electrical pass-throughs) may be disposed between an AC distribution assembly and a puck. In some embodiments, the thermal insulator may be made of alumina ($Al_2O_3$).

In some embodiments, temperature cycling (e.g., heating and cooling of the puck during processing, heating and cooling between processing cycles, heating and cooling for maintenance events, etc.) may induce stress on electrical components of the substrate support assembly (e.g., the electrical pass-throughs from the AC distribution assembly to the puck). In some embodiments, temperature resistant materials may be used for the electrical systems in the thermal insulator disposed between the puck and the AC distribution assembly. In some embodiments, components that resist failure due to thermal cycling may be utilized. For example, electrical connections may be formed by screws disposed in threaded in terminals. Temperature cycling may cause these connections to loosen (e.g., due to thermal expansion and contraction, due to thermal expansion coefficient mismatches between the screw and the terminal, or the like). In some embodiments a component that provides a corrective force may be utilized, such as a conical safety washer, to maintain electrical connections associate with a substrate support system.

Aspects of the present disclosure result in technical advantages over conventional solutions. In conventional systems, components of a processing assembly (e.g., substrate support assembly) may be substantially in contact with each other. Portions of the substrate support assembly may be resistant to elevated temperatures (e.g., the puck, the base plate, the cooling plate, etc.). Portions of the substrate support assembly may be sensitive to elevated temperatures (e.g., the insulator plate, the AC distribution assembly, etc.). In some embodiments, components of the substrate support assembly may protect sensitive components from experiencing a high temperature environment. For example, coolant may flow through the cooling plate, drawing heat away from the system and protecting components (e.g., components disposed on the opposite side of the cooling plate from the puck) from high temperature conditions.

In some cases, cooling operations may be interrupted. Equipment/sensor malfunction, coolant blockage, power loss, initiation of emergency protocols, or the like may interrupt operations targeting mitigation of heat transfer to sensitive components. For example, conditions may trigger an emergency stop on operation of a processing chamber during a high temperature operation. Such an emergency stop may, for example, stop the flow of coolant through the cooling plate. In conventional systems, heat may flow (e.g., via conduction) within and between components of the system until equilibrium is reached with the environment. In cases where cooling operations are interrupted but high temperatures are still present in the system (e.g., in an emergency machine off (EMO) protocol, where residual heat in the puck is present after the circulation of coolant in the cooling plate has stopped), components shielded from high temperatures during normal operation of the processing system may be exposed to elevated temperatures. In one example, a puck may be operated at high temperature (e.g., above 300° C.). During normal operation, temperature mitigation components (e.g., the cooling plate) may allow sensitive components to be operated at a much lower temperature (e.g., an insulator plate may operate around 60° C., AC distribution system may be protected from high temperatures, etc.). In an EMO operation, residual heat in the puck may be transferred to the cooling plate, base plate, AC distribution assembly, and insulator plate. In some cases, significant temperature increase may be experienced by the insulator plate and/or components of the AC distribution assembly. In some embodiments, the elevated temperatures experienced by the temperature-sensitive components may cause physical or material damage to the components. In some embodiments, temperatures experienced by components of the substrate support assembly may induce a phase change, shape change, partial phase change, glass transition, or the like in the components. Additionally, different components may experience different expansion from the heat due to different coefficients of thermal expansion. One or more of the phase change, shape change, softening, expansion, etc. of the components may compromise seals between components and cause leakage of one or more gases, failure of one or more vacuum seals, or the like.

In an example, the insulator plate may comprise a styrene/divinylbenzene copolymer, with a glass transition temperature $T_g$ of ~114° C. The material of the insulator plate may soften at temperatures experienced during an EMO event. In some embodiments, temperatures experienced by components of the substrate support assembly may cause a reduction in effective operation of those components. For example, an AC distribution assembly may include one or more springs, for maintaining pressure and contact of an electrical connection. At high temperatures, components like springs may become damaged (e.g., due to atomic rearrangements that result in a loss of elasticity of the spring).

High temperatures experienced by traditionally temperature-shielded components may induce thermal expansion in the components. An electrical connection may be generated by tightening a screw into a terminal, and thermal expansion may loosen the connection. An insulator plate may expand due to increased temperatures, which may inhibit one or more functions of the insulator plate. For example, expansion of the insulator plate may interfere with one or more seals made by the plate, e.g., gas/vacuum seals (such as for supplying helium through the puck, for providing a vacuum chucking force on the substrate, providing a vacuum seal, for operation of lift pins, or the like), liquid seals (such as for coolant to be supplied to the cooling plate), etc. In some embodiments, an insulator plate may include one or more components of different composition than the bulk of the plate, e.g., pass-through channels may be installed for passing various fluids through the insulator plate. Thermal expansion of these other components may act differently than the insulator plate, and further disrupt functionality of the insulator plate.

Aspects of the present disclosure may address one or more of these shortcomings of conventional systems. In some embodiments, temperature-sensitive components of an AC distribution assembly may be protected, e.g., in an EMO condition. Electrical connections proximate to the high-temperature puck may be resistant to high temperatures. For example, one or more terminals may be coupled to components of the puck (e.g., heater electrodes, chucking electrodes, etc.). The terminals may be made of temperature-resistant materials. The terminals may be threaded and may couple to threaded fasteners (e.g., screws, bolts). The threaded fasteners may be coupled to electrical components (e.g., wires) for providing a connection between one or more power sources and components of the puck. Affixing the threaded fasteners may include affixing one or more additional components, including conical washers, disc springs, curved disc springs, or the like. The additional fastening components may provide protection to the electrical connections, e.g., a conical washer may provide additional force to protect the system from failure due to temperature cycling. In some embodiments, sensitive electrical components may be protected by further insulation (e.g., one or more insulating materials may be included in the substrate support assembly between the puck and various electronic components), by controlling heat flow paths (e.g., electrical paths may be configured to transfer heat away from sensitive components, for example by extending distances or increasing surface area), or the like.

In some embodiments, heat transfer between components of the substrate support assembly may be controlled. For example, a recess in portions of a surface of the insulator plate (e.g., the surface proximate to the base plate) may limit heat transfer between the base plate and the insulator plate. In some conditions, e.g., an EMO condition, the base plate may increase in temperature (e.g., due to heat transfer from residual heat of the puck) beyond a temperature appropriate for the insulator plate (e.g., beyond a glass transition temperature of a material comprising the insulator plate). Temperature increase of the insulator plate may be reduced by limiting contact between the insulator plate and the base plate.

Reducing temperature changes in the insulator plate may improve operation of the substrate support assembly. Increased temperature of the insulator plate (e.g., beyond a glass transition temperature) may cause the insulator plate to become soft, pliable, etc. This may alter the shape of the component, alter the performance of the component, irreversibly damage the component, etc. Increased temperature of the insulator plate may cause thermal expansion of the plate. In some embodiments, one or more seals (e.g., vacuum seals, fluid seals, etc.) may be generated between the insulator plate and one or more other components. Thermal expansion of the insulator plate may disrupt one or more seals of the insulator plate, which may cause unintended mixing of fluids, delivery of fluids to unintended portions of the processing system, etc.

In one aspect of the disclosure, a substrate support assembly includes a plate structure and an insulator structure. The plate structure includes an upper plate and a lower plate. The lower plate includes a lower plate structure surface. The insulator structure is disposed beneath the plate structure. The insulator structure includes a lower insulator structure surface and an upper insulator structure surface. A first portion of the upper insulator structure surface is recessed with respect to a second portion of the upper insulator structure surface. The first portion of the upper insulator structure surface forms an interior volume with the lower plate structure surface.

In another aspect of the present disclosure, an insulator structure of a substrate support assembly includes a lower insulator structure surface and an upper insulator structure surface. A first portion of the upper insulator structure surface is recessed with respect to a second portion of the upper insulator structure surface.

In another aspect of the present disclosure, a process chamber includes a substrate support assembly. The substrate support assembly includes a puck for supporting the substrate. The puck includes a heating element. The substrate support assembly includes a radio frequency (RF) insulator structure. The RF insulator structure includes a lower insulator structure surface and an upper insulator structure surface. A first portion of the upper insulator structure surface is recessed with respect to a second portion of the upper insulator structure surface.

In another aspect of the disclosure, a substrate support assembly includes a puck, a power distribution assembly, and an alumina insulator. The puck includes a heating element. The alumina insulator is disposed between the puck and the power distribution assembly. An electrical connection between the heating element and the power distribution assembly includes a terminal and a conical washer.

In another aspect of the present disclosure, a process chamber includes a puck for supporting a substrate, a power distribution assembly, and a ceramic insulator. The puck includes a heating element. The ceramic insulator is disposed between the puck and the power distribution assembly.

In another aspect of the present disclosure, a method includes recessing a first portion of a radio frequency (RF) insulator plate, such that a space is formed between the RF insulator plate and an adjacent component of a process chamber. The method further includes installing an insulator between a heated puck of the process chamber and a power distribution assembly of the process chamber. The insulator reduces heat transfer to the component of the process chamber in an emergency machine off (EMO) condition.

Figure 1:
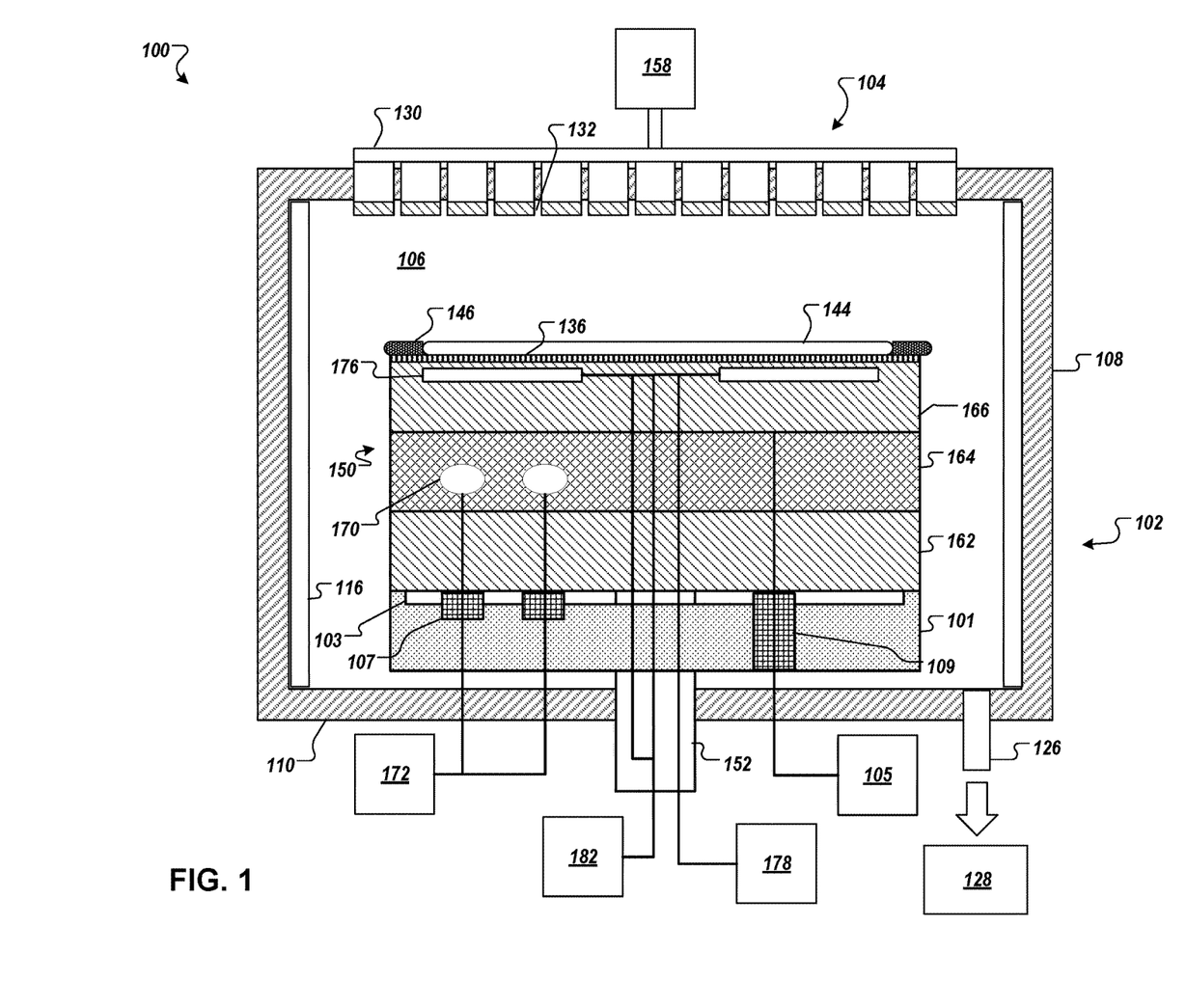
FIG. 1 is a section view of a substrate processing chamber including a substrate support assembly, according to some embodiments.

FIG. 1 is a sectional view of a substrate processing chamber 100 including a substrate support assembly 150, according to some embodiments. Substrate support assembly 150 includes a puck 166 (e.g., may include an electrostatic chuck (ESC)). The puck 166 may perform chucking operations, e.g., vacuum chucking, electrostatic chucking, etc. Puck 166 may include an upper puck plate bonded to a lower puck plate (not shown). Puck 166 may be coupled to a cooling plate 164 (e.g., may be in thermal communication with a cooling plate).

Substrate support assembly 150 may further include base plate 162 and insulator plate 101. Base plate 162 may be coupled to puck 166, e.g., may be attached to puck 166 by fasteners. Base plate 162 may support cooling plate 164. Insulator plate 101 may comprise a material that insulates against RF radiation, such as a plastic material, a polymer material such as a thermoplastic (e.g., a cross-linked polymer of polystyrene and divinylbenzene or a polyamideimide). Insulator plate 101 may include recess 103. Recess 103 may form a gap between at least a portion of an upper surface of insulator plate 101 and a lower surface of another component (e.g., base plate 162). In some embodiments, a gap may be formed by a recess in the upper component (e.g., base plate 162).

Processing chamber 100 includes chamber body 102 and lid 104 that enclose an interior volume 106. Chamber body 102 may be fabricated from aluminum, stainless steel, or other suitable material. Chamber body 102 generally includes sidewalls 108 and a bottom 110. An outer liner 116 may be disposed adjacent to side walls 108, e.g., to protect chamber body 102. Outer liner 116 may be fabricated and/or coated with a plasma or halogen-containing gas resistant material. Outer liner 116 may be fabricated from or coated with aluminum oxide. Outer liner 116 may be fabricated from or coated with yttria, yttrium alloy, oxides thereof, etc.

Exhaust port 126 may be defined in chamber body 102, and may couple interior volume 106 to a pump system 128. Pump system 128 may include one or more pumps, valves, lines, manifolds, tanks, etc., utilized to evacuate and regulate the pressure of interior volume 106.

Lid 104 may be supported on sidewall 108 of chamber body 102. Lid 104 may be openable, allowing access to interior volume 106. Lid 104 may provide a seal for processing chamber 100 when closed. Gas panel 158 may be coupled to processing chamber 100 to provide process, cleaning, backing, flushing, etc., gases to interior volume 106 through gas distribution assembly 130. Gas distribution assembly 130 may be integrated with lid 104.

Examples of processing gases that may be used in processing chamber 100 include halogen-containing gases, such as $C_2F_6$, $SF_6$, $SiCl_4$, HBr, $NF_3$, $CF_4$, $CHF_3$, $CH_2F_3$, $Cl_2$ and $SiF_4$. Other reactive gases may include $O_2$ or $N_2O$. Non-reactive gases may be used for flushing or as carrier gases, such as $N_2$, He, Ar, etc. Gas distribution assembly 130 (e.g., showerhead) may include multiple apertures 132 on the downstream surface of gas distribution assembly 130. Apertures 132 may direct gas flow to the surface of substrate 144. In some embodiments, gas distribution assembly may include a nozzle (not pictured) extended through a hole in lid 104. A seal may be made between the nozzle and lid 104. Gas distribution assembly 130 may be fabricated and/or coated by a ceramic material, such as silicon carbide, yttrium oxide, etc., to provide resistance to processing conditions of processing chamber 100.

Substrate support assembly 150 is disposed in interior volume 106 of processing chamber 100 below gas distribution assembly 130. Substrate support assembly 150 holds a substrate 144 during processing. An inner liner (not shown) may be coated on the periphery of substrate support assembly 148. The inner liner 118 may share features (e.g., materials of manufacture, function, etc.) with outer liner 116.

Substrate support assembly 148 may include supporting pedestal 152, insulator plate 101, base plate 162, cooling plate 164, and puck 166. Puck 166 may include electrodes 176 for providing one or more functions. Electrodes 176 may include chucking electrodes (e.g., for securing substrate 144 to an upper surface of puck 166), heating electrodes, etc.

Protective ring 146 may be disposed over a portion of puck 166 at an outer perimeter of puck 166. Puck 166 may be coated with a protective layer (not shown). Protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), quartz, SiC (silicon carbide), $Si_3N_4$ (silicon nitride), Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may be a ceramic composite such as YAG distributed in an alumina matrix, a yttria-zirconia solid solution, a silicon carbide-silicon nitride solid solution, or the like. The protective layer may be sapphire or MgAlON.

Puck 166 may include an upper puck plate (not shown) and a lower puck plate (not shown) bonded by a metal bond. The upper puck plate may be a dielectric or electrically insulating material (e.g., having an electrical resistivity of greater than 1013 Ohm·centimeter) that is usable for substrate processing applications. In some embodiments, the upper puck plate may be made of materials suitable for use from about 20° C. to about 500° C. The upper puck plate may be composed of AlN. An AlN upper puck plate may be doped or undoped. For example, the upper puck plate may be doped with samarium oxide ($Sm_2O_3$), cerium oxide ($CeO_2$), titanium dioxide ($TiO_2$), or a transition metal oxide. The upper puck plate may be composed of $Al_2O_3$. An $Al_2O_3$ upper puck plate may be doped or undoped. For example, the upper puck plate may be doped with titanium dioxide ($TiO_2$) or a transition metal oxide.

The lower puck plate may have a coefficient of thermal expansion that is matched to a coefficient of thermal expansion of the upper puck plate. The lower puck plate may be a SiC porous body that is infiltrated with an AlSi alloy (referred to as AlSiSiC). The lower puck plate may be AlN or $Al_2O_3$. The lower puck plate may be undoped AlN or undoped $Al_2O_3$. The lower puck plate may be composed of the same material as the upper puck plate. The lower puck plate may be composed of molybdenum. The lower puck plate may be coated with a resistant coating, e.g., a plasma resistant coating, a halogen resistant coating, etc. Coating the lower puck plate may include coating exposed surfaces of the lower puck plate after the lower puck plate is bonded to the upper puck plate. A coating (e.g., plasma resistant coating, halogen resistant coating, etc.) of the lower puck plate may cover sidewalls and an exposed horizontal step of the lower puck plate. The plasma resistant coating may include $Al_2O_3$, $Y_2O_3$, and/or any of the materials described with reference to protective layer 136.

Processing chamber 100 may further include a mounting plate (not shown), which is coupled to the bottom 110 of chamber body 102 and includes passages for routing utilities (e.g., fluids, power lines, sensor leads, etc.) to components of substrate support assembly 150. For example, a coolant fluid may be provided via the passages to cooling plate 164, power may be supplied via the passages to electrodes 176 of puck 166, etc. Cooling plate 164 may include one or more conduits 170, e.g., for facilitating fluid flow of a coolant.

Conduits 170 may be fluidly coupled to fluid source 172 that circulates a temperature regulating fluid through conduits 170. Conduits 170 and heating elements (e.g., electrodes 176 in puck 166, one or more heating elements disposed within cooling plate 164 (not shown), etc.) may be used to control the temperature of puck 166, substrate 144, etc. Puck 166 may include separately controlled heating zones that may maintain different temperatures. Puck 166 may include radial heating zones, segment heating zones, etc. Temperature of puck 166, substrate 144, cooling plate 164, base plate 162, etc., may be monitored by one or more temperature sensors.

Puck 166 may further include multiple gas passages such as grooves, mesas, and other features that may be formed in an upper surface of puck 166. Gas passages may be fluidly coupled to a gas source 105. Gas from gas source 105 may be utilized as a heat transfer or backside gas, may be utilized for control of one or more lift pins of puck 166, etc. Multiple gas sources may be utilized (not shown). Gas passages may provide a gas flow path for a backside gas such as He via holes drilled in puck 166. Backside gas may be provided at a controlled pressure into gas passages to enhance heat transfer between puck 166 and substrate 144.

Insulator plate 101 may include one or more inserts 107 and/or one or more plugs 109. In some embodiments, recess 103 may inhibit the generation of a fluid seal (e.g., coolant seal, vacuum seal, gas seal, etc.) between insulator plate 101 and base plate 162. Plugs 109 and inserts 107 may facilitate generation of seals between components by extending at least partially through the gap formed by recess 103 to generate a seal. Implementations of sealing components proximate to recess 103 are discussed in more detail in connection with FIG. 2.

Puck 166 may include one or more clamping electrodes. The clamping electrodes may be controlled by chucking power source 182. Clamping electrodes may further couple to one or more RF power sources through a matching circuit for maintaining a plasma formed from process and/or other gases within processing chamber 100. The RF power sources may be capable of producing an RF signal having a frequency from about 50 kilohertz (kHz) to about 3 gigahertz (GHz) and a power of up to about 10,000 Watts. Heating electrodes of puck 166 may be coupled to heater power source 178.

Figure 2:
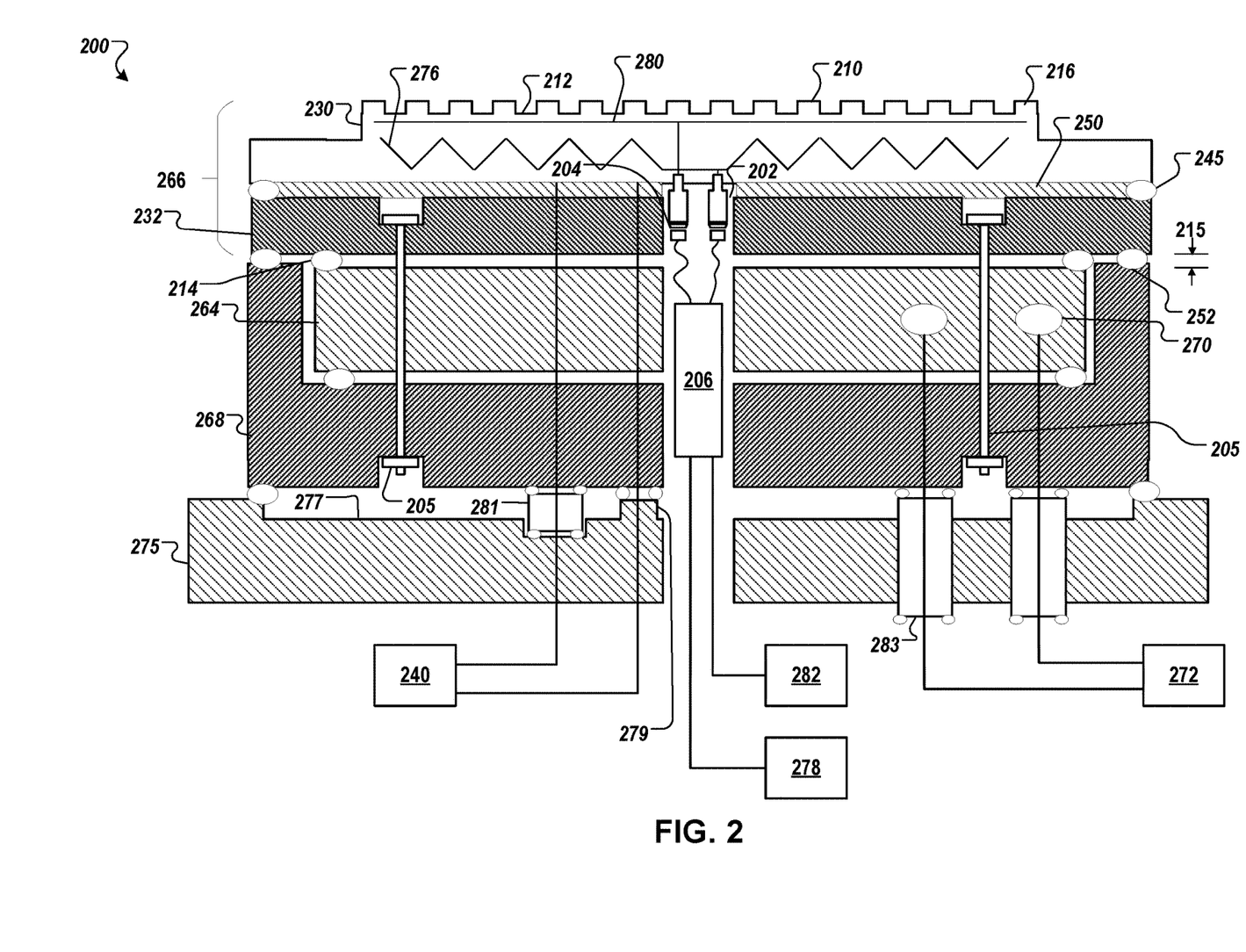
FIG. 2 is a sectional side view of a substrate support assembly, according to some embodiments.

FIG. 2 is a sectional side view of a substrate support assembly 200, according to some embodiments. Substrate support assembly includes a puck 266 made up of an upper puck plate 230, and a lower puck plate 232 that are bonded together by bond 250. In some embodiments bond 250 may be a metal bond, e.g., may comprise aluminum. In some embodiments bond 250 may be a diffusion bond, e.g., may be formed by subjected upper puck plate 230 and lower puck plate 232 to heat and compressing pressure for a time to generate a bond. In some embodiments, bond 250 may be a ceramic bond or a glass bond. Proximate to bond 250 there may disposed O-ring 245. O-ring 245 may be a plasma resistant O-ring, a high temperature O-ring, etc. O-ring 245 may be made of a perfluoropolymer (PFP). O-ring 245 may degrade (e.g., due to processing conditions of the processing chamber), and subsequently be replaced, e.g., by stretching the old O-ring over upper puck plate 230, and stretching a new O-ring over upper puck plate 230. O-ring 245 may protect bond 250 from erosion by plasma.

Upper puck plate 230 includes mesas 210, channels 212, and outer ring 216. Upper plate 230 may include one or more electrodes, e.g., clamping electrodes 280 (e.g., in an electrostatic chuck), heating element 276, etc. Electrodes may be coupled to terminals 202 (e.g., threaded terminals). Terminals 202 may be further coupled to threaded fasteners, and may be secured with an assembly including conical washers 204. Terminals 202 may further be coupled to a distribution assembly 206. Distribution assembly 206 (e.g., AC distribution assembly, electrical power delivery system, or the like) may deliver power to various components of puck 266. Distribution assembly 206 may electrically couple a power supply to components of substrate support assembly 200. In some embodiments, distribution assembly 206 may include spring-loaded pins for electrical connections, e.g., pogo pins. In some embodiments, the electrical path may be configured to shield distribution assembly 206 from high temperatures, e.g., wires connecting terminals 202 to distribution assembly 206 may be configured to lose some heat to the environment that may otherwise be delivered to distribution assembly 206.

Distribution assembly 206 may further be coupled to one or more power sources, e.g., clamping electrodes 280 may be coupled via distribution assembly 206 to chucking power source 282, heating element 276 may be coupled via distribution assembly 206 to heater power source 278, etc.

Upper puck plate 230 may have a thickness of about 1-100 mm. Upper puck plate 230 may have a thickness of about 3-25 mm. In some embodiments, upper puck plate 230 may have a thickness of about 3 mm. Clamping electrodes 280 may be located about 1 mm from an upper surface of upper puck plate 230. Heating element 276 may be located about 1 mm under clamping electrode 280. Heating element 276 may be a screen printed heating element having a thickness of about 10-200 micrometers (μm) Alternatively, the heating elements may be resistive coils that occupy about 1-3 mm of thickness of upper puck plate 230. In some embodiments, lower puck plate 232 may have a thickness of about 1-100 mm. In some embodiments, lower puck plate 232 may have a thickness of about 8-25 mm.

Upper puck plate 230 may include electrically insulating materials such as aluminum nitride (AlN), aluminum oxide ($Al_2O_3$), or the like. Lower puck plate 232 and upper puck plate 230 may be made of the same materials. Lower puck plate 232 and upper puck plate 230 may be made of different materials.

Lower puck plate 232 is in thermal communication with cooling plate 264. Cooling plate 264 may include one or more conduits 270 (e.g., cooling channels, coolant flow paths, etc.) in fluid communication with fluid source 272. Conduits 270 may extend throughout cooling plate 264 in any path, though only two conduits are shown in FIG. 2. Cooling plate 264 may be constructed of a material to facilitate transfer of heat, e.g., from puck 266 to the coolant fluid, such as aluminum.

In some embodiments (not shown), a backing puck plate is bonded to a backside of the lower puck plate 232. The backing puck plate may be bonded to the backside of the lower puck plate 232 by a metal bond, a ceramic bond, or a diffusion bond, for example. The backing puck plate may be formed of a same material as the upper puck plate 230 in embodiments. The lower puck plate may include features that accommodate fasteners (e.g., may include embedded inserts such as embedded threaded inserts, e.g., heli-coils). The backing puck plate may include holes that provide access to the features in the lower puck plate 232 (e.g., so that the shafts of threaded fasteners can access the threaded inserts in the lower puck plate 232.

Cooling plate 264 may be supported by base plate 268. Base plate 268 may facilitate thermal communication between cooling plate 264 and puck 266. For example, base plate 268 may be coupled to puck 266 by multiple fasteners 205. Fasteners 205 may be threaded fasteners such as nut and bolt pairs. Lower puck plate 232 may include features for accommodating fasteners 205. Base plate 268 may include features for accommodating fasteners 205. Features may include through-holes, slots, or the like. Fasteners may include washers, foil, or other load spreading materials known in the art. In some embodiments, fasteners 205 may instead couple cooling plate 264 to puck 266.

One or more portions of base plate 268 may extend up alongside, around, through, etc., cooling plate 264. For example, cooling plate 264 may be nested in base plate 268. Extended portions of base plate 268 may be in thermal communication with puck 266, e.g., may contact puck 266, may be proximate to puck 266, may be separated from puck 266 by a thermally conductive medium, or the like. Portions of base plate 268 may be separated from puck 232 by a sealing component, e.g., O-ring 252. Various structures may generate fluid seals via fluidly sealing components, such as O-rings.

In some embodiments, a gap 215 is maintained between cooling plate 264 and puck 266. The gap may be formed in some embodiments by O-ring 214. O-ring 214 may be, for example, a polyimide or PFP O-ring. O-ring 214 may be vulcanized or otherwise disposed on cooling plate 264. O-ring 214 may be vulcanized or otherwise disposed on the bottom side of lower puck 232. Fasteners 205 may tighten and compress O-ring 214. Tension in the fasteners (e.g., by careful application of torque) and resistance by O-ring 214 may generate an approximately consistent separation between puck 266 and cooling plate 264. This may ensure heat transfer between the components is approximately uniform throughout the interface between the two components. In some embodiments, gap 215 may be approximately 0.05 mm (2 thousandths of an inch) to 0.25 mm (10 thousandths of an inch). In some embodiments, a thermally conductive gas may be in gap 215 (e.g., flow of a thermally conductive gas may be maintained). In some embodiments, vacuum conditions may be maintained in gap 215, e.g., to reduce heat transfer between cooling plate 264 and puck 266. Existence of gap 215 may allow temperatures of cooling plate 264 and puck 266 to be significantly different, may allow each component to expand and contract separately (e.g., due to thermal cycling), and the like.

In some embodiments, cooling plate 264 may be in contact with puck 266. In some embodiments, no gap is maintained between cooling plate 264 and puck 266. For example, cooling plate 264 and/or base plate 268 may be bonded to puck 266 by an organic bond, a metal bond, or a ceramic bond. If cooling plate is bonded to puck 266, then fasteners may not be used in some embodiments.

In some embodiments, cooling plate 264 may have force exerted upon it from an elastic medium, e.g., one or more springs (not shown) may be disposed between the bottom of cooling plate 264 and base plate 268. In some embodiments, a material may be disposed between the plates (e.g., a thermally insulating material, a thermally conductive material, etc.). The material may be selected for target heat transfer properties. In some embodiments, an interface between cooling plate 264 and base plate 268 may include similar features to an interface between puck 266 and cooling plate 264.

In some embodiments, base plate 268 is disposed proximate to insulator plate 275. Insulator plate 275 may be made of a material that insulates against RF radiation. Insulator plate 275 may include recessed portion 277. In some embodiments, recessed portion 277 may be recessed compared to an outer ring-shaped area of insulator plate 275. In some embodiments, recessed portion 277 may be recessed about 0.1-1.0 mm, such as about 0.2 mm, 0.3 mm, 0.4 mm, 0.5 mm (20 thousandths of an inch), 0.6 mm, 0.7 mm, 0.8 mm, 0.9 mm, and so on. In some embodiments, the recess may limit contact and heat transfer between base plate 268 and insulator plate 275. Limiting heat transfer between base plate 268 and insulator plate 275 may protect insulator plate 275 from high temperatures that may damage insulator plate 275, e.g., in EMO conditions.

In some embodiments, one or more channels (e.g., holes, flow paths, features, etc.) may exist through insulator plate 275. In some embodiments, one or more channels may provide a flow path for a fluid from a source (e.g., fluid source 272, gas supply 240, etc.) to a target delivery region, e.g., cooling plate 264, puck 266, etc. Channels may provide a flow path from a fluid reservoir to a fluid delivery area. Gas supply 240 may be utilized to supply a backside gas for the substrate, operation gas for a lift pin assembly, or the like. In some embodiments, the channels may be configured to seal, e.g., to avoid leakage of the fluid into recessed portion 277. In some embodiments, one or more areas of the top surface of insulator plate 275 may not be recessed, be less recessed, or the like, e.g., unrecessed portion 279. An unprocessed portion may be configured to generate a seal with base plate 268, e.g., via the inclusion of one or more O-rings (pictured proximate to unrecessed portion 279). In some embodiments, a channel through insulator plate 275 or recess in insulator plate 275 may include an insert, e.g., insert 281. In some embodiments, an insert may be disc-shaped or ring shaped, e.g., cylindrical including a cylindrical hole sharing an axis of symmetry with the outer surface. In some embodiments, the insert may generate a seal with insulator plate 275, e.g., facilitated by one or more O-rings disposed between insert 281 and insulator plate 275. In some embodiments, an insert may generate a seal with base plate 268, e.g., facilitated by one or more O-rings disposed between insert 281 and base plate 268. An insert may be constructed of a material that can withstand elevated temperatures, e.g., alumina. An insert may be constructed of a thermally insulating material that may resist transferring heat from base plate 268 to insulator plate 275, e.g., alumina. In some embodiments, an insert facilitating communication through insulator plate 275 (e.g., fluid communication, electrical communication, etc.) may extend through the entirety of insulator plate 275, e.g., insert 283. An insert may fluidly couple one or more fluid reservoirs to one or more fluid delivery zones, such as coolant, cooling fluid, working gas, or the like. In some embodiments, an insert that extends through insulator plate 275 may generate a seal with another component (not pictured), e.g., facilitated by one or more O-rings disposed below insert 283.

In some embodiments, different portions of insulator plate 275 may be made of different materials, e.g., an outer ring (such as the unrecessed outer portion of insulator plate 275) may be made of alumina and an inner disc (such as the recessed portion 277) may be made of an insulating material (e.g., plastics, polymers, etc.). In some embodiments, portions of recessed portion 277 of insulator plate 275 may be recessed a different distance or amount, e.g., an area proximate to a seal (e.g., a disc-shaped region around an insert) may be recessed less than the surrounding area. Varying recess distance in this way may improve the integrity of one or more seals (e.g., made between the insert and base plate 268). In some embodiments, one or more areas of recessed portion 277 may be augmented by additional material. For example, material may be disposed, deposited, etc., on top of recessed portion 277. In some embodiments, a polyimide film may be deposited in one or more areas of recessed portion 277 (e.g., in regions proximate to a seal, regions proximate to an insert, etc.). In some embodiments, one or more shims may be disposed between base plate 268 and insulator plate 275. In some embodiments, areas of less distance between base plate 268 and insulator plate 275 (e.g., areas where insulator plate 275 is recessed less, areas where a polyimide film is deposited, areas where a shim is disposed, etc.) may be spaced throughout the surface of insulator plate 275. In some embodiments, a region of the upper surface of insulator plate 275 that is recessed may allow some deformation of base plate 268, of insulator plate 275, etc. Reduction of the distance (e.g., via different levels of recession, deposited films, shims, or the like) between certain portions of proximate surfaces of base plate 268 and insulator plate 275 may reduce the effect of deformation while maintaining limited heat transfer between base plate 268 and insulator plate 275. In some embodiments, at least a portion of the gap formed by recessed portion 277 may be filled with a thermally insulating material.

Figure 3A:
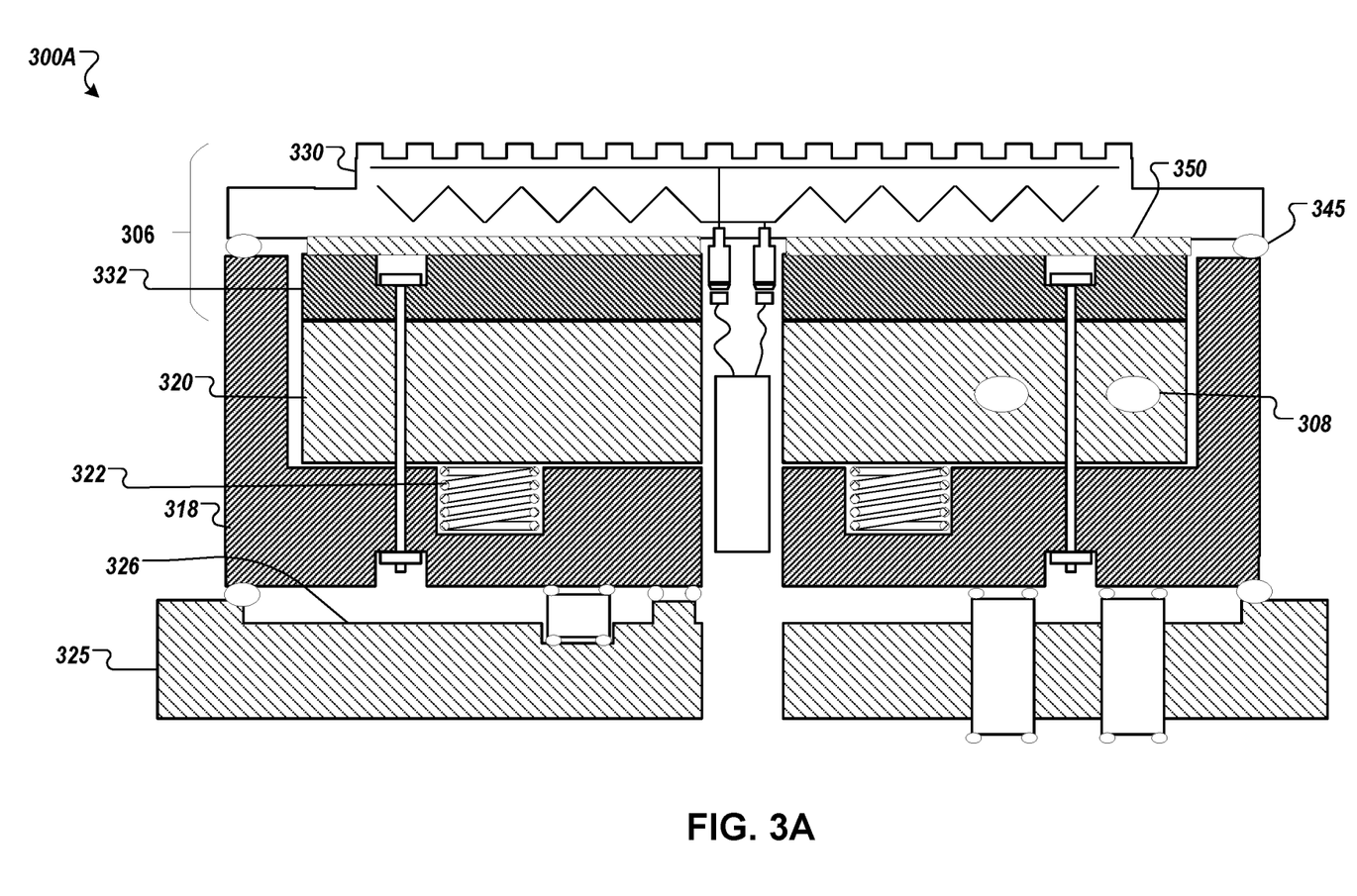
FIG. 3A depicts a simplified sectional side view of components of a substrate support assembly, according to some embodiments.

FIG. 3A depicts a simplified sectional side view of components of an example substrate support assembly 300A, according to some embodiments. Substrate support assembly 300A shares some features with substrate support assembly 200 of FIG. 2. Substrate support assembly 300A includes a puck 306, including upper puck plate 330 and lower puck plate 332. The puck may be an electrostatic puck, a vacuum puck, etc. The puck may be used to support a substrate during processing. Components of the puck (e.g., upper puck plate 330 and lower puck plate 332) may be bonded by a bond 350. Bond 350 may be a metal bond. Bond 350 may be a diffusion bond. Bond 350 may be a glass bond or a ceramic bond. Upper puck plate 330 may include features similar to upper puck plate 230 of FIG. 2, e.g., heating electrodes, chucking electrodes, etc. Upper puck plate 330 and lower puck plate 332 may be comprised of materials with approximately matching coefficients of thermal expansion. Upper puck plate 330 may have a thickness of about 3-10 mm. Upper puck plate 330 may have a thickness of about 3-5 mm. Lower puck plate 332 may have a thickness of approximately 8-25 mm. Lower puck plate 332 may have a thickness of approximately 8-20 mm. Lower puck plate 332 may have a thickness of about 12 mm.

Upper puck plate 330 may have a larger surface (e.g., top surface) than lower puck plate 332. Upper puck plate 330 may have a diameter that is larger than a diameter of lower puck plate 332.

In some embodiments (not shown), a backing puck plate is bonded to a backside of the lower puck plate 332. The backing puck plate may be bonded to the backside of the lower puck plate 332 by a metal bond, ceramic bond, or diffusion bond, for example. The backing puck plate may be formed of a same material as the upper puck plate 330 and/or lower puck plate 332. The lower puck plate may include features that accommodate fasteners (e.g., may include embedded inserts such as embedded threaded inserts, e.g., heli-coils). The backing puck plate may include holes that provide access to the features of lower puck plate 332 (e.g., so that shafts of threaded fasteners can access the threaded inserts in lower puck plate 332).

An outer size of base plate 318 may be similar to an outer size of upper puck plate 330. An outer diameter of base plate 318 may be similar to an outer diameter of upper puck plate 330. One or more O-rings 345 may be disposed between upper puck plate 330 and base plate 318. O-ring 345 may provide a vacuum seal between an interior space of the substrate support assembly 300A and the processing chamber environment. O-ring 345 may be made of a material appropriate for the processing chamber environment. O-ring 345 may resist high temperatures, resist corrosion, resist degradation, etc. O-ring 345 may protect bond 350 from erosion, from interactions with plasma, from corrosion, etc.

Substrate support assembly 300A further includes cooling plate 320. Cooling plate 320 may be a heat sink, an inner heat sink, a heat exchanger, etc. Cooling plate 320 may be coupled to base plate 318 by one or more springs 322. Springs 322 may operate to press cooling plate 320 against lower puck plate 332. Springs 322 may be coil springs. Springs 322 may apply a force to press cooling plate 320 against puck 306. Cooling plate 320 may have one or more conduits 308. The conduits 308 may be in fluid communication with a fluid source (not shown). Cooling plate 320 may be in contact with puck 306. In some embodiments, cooling plate 320 and/or base plate 318 may be bonded to puck 306 by an organic bond, metal bond, ceramic bond, or the like. If cooling plate 320 and/or base plate 318 is bonded to puck 306, fasteners may not be used in some embodiments. A gap may be maintained between cooling plate 320 and puck 306.

Cooling plate 320 may absorb heat from puck 306. There may be a component disposed between lower puck plate 332 and cooling plate 320. For example, a gasket may be disposed between lower puck plate 332 and cooling plate 320. The component may have low thermal conductivity. The component may act as a thermal choke. The component may be compressible. The component may act to increase uniformity of thermal communication between different regions of lower puck plate 332 and cooling plate 320. By providing some thermal insulation between cooling plate 320 and lower puck plate 332, puck 306 may be maintained at higher temperatures than cooling plate 320, higher temperatures than a cooling fluid provided via conduits 308, etc. In some embodiments, puck 306 may be heated to temperatures of 200-400° C. Cooling plate 320 may maintain a temperature below about 120° C. In some embodiments, puck 306 may be heated to about 250° C. and cooling plate 320 may maintain a temperature of about 60° C. In some embodiments, puck 306 is free to thermally expand and/or contract independently of cooling plate 320, base plate 318, etc.

Substrate support assembly 300A includes insulator plate 325. Insulator plate 325 may share features with insulator plate 275 of FIG. 2. Insulator plate 325 may include recessed portion 326. Recessed portion 326 may be recessed compared to a non-recessed portion of insulator plate 325. A non-recessed portion may support base plate 318. A non-recessed portion may comprise a rim around a diameter of insulator plate 325. Recessed portion 326 may limit contact between base plate 318 and insulator plate 325. Recessed portion 326 may limit heat transfer between base plate 318 and insulator plate 325. Recessed portion 326 may share features (dimensions, etc.) with recessed portion 277 of FIG. 2. In some embodiments, insulator plate 325 may be composed of multiple components, multiple materials, etc. For example, recessed portion 326 may be of an insulating material such as a plastic or polymer, and the unrecessed portion may be of a ceramic such as alumina.

Figure 3B:
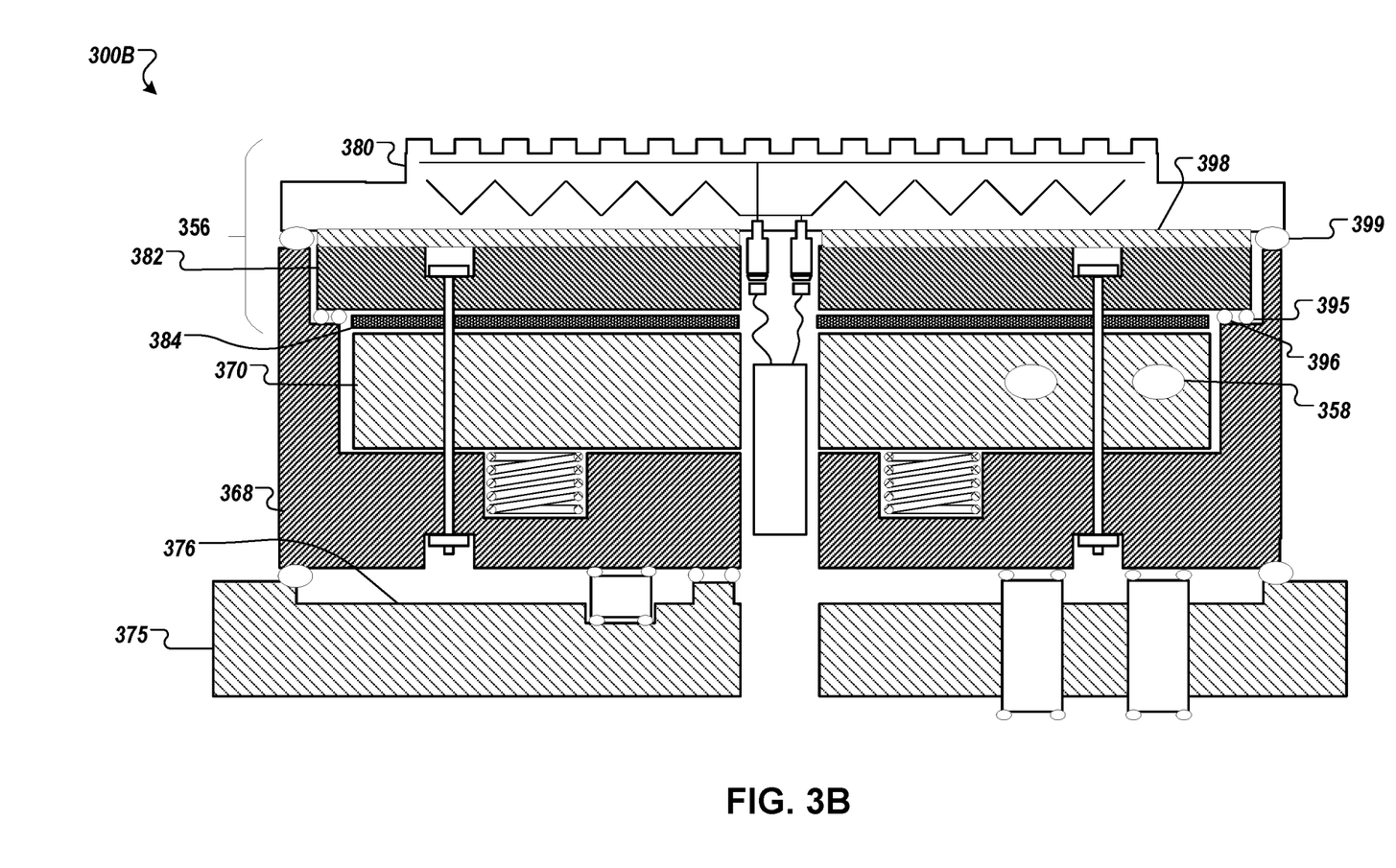
FIG. 3B depicts a simplified sectional side view of a substrate support assembly including a backing plate, according to some embodiments.

FIG. 3B depicts a simplified sectional side view of components of an example substrate support assembly 300B, according to some embodiments. Substrate support assembly 300B shares some features with substrate support assembly 200 of FIG. 2. Substrate support assembly 300B shares some features with substrate support assembly 300A of FIG. 3A. Substrate support assembly 300B includes puck assembly 356 including upper puck plate 380, lower puck plate 382, and backing plate 384. Note that the backing plate 384 may have a greater thickness relative to the thicknesses of the upper puck plate 380 and the lower puck plate 382 than is shown. In some embodiments, backing plate 384 is omitted. One or more thermal interface layers and/or materials separate the lower puck plate 382 from cooling plate 370. In some embodiments, backing plate 384 is included, and one or more thermal interface layers and/or materials separate backing plate 384 from cooling plate 370. The thermal interface materials and/or layers may include one or more electrically and/or thermally conductive layers and/or one or more electrically and/or thermally insulative layers. For example, electrically and/or thermally conductive layers may include a flexible graphite and electrically and/or thermally insulative layers may include polyimide, a perforluoropolymer, and so on. The thermal interface layer or layers may have varying thicknesses, such as from a fraction of a millimeter (e.g., 0.1 mm) to centimeters, (e.g., 4 mm). In some embodiments, the thermal interface layer or layers have varying shapes. In some embodiments, multiple thermal interface layers are used, which may include 2-10 layers. In such embodiments, different thermal interface layers may be formed of different materials.

Components of puck assembly 356 may be bonded together by metal bonds, e.g., metal bond 398. Bond 398 may in some embodiments be a ceramic bond, diffusion bond, glass bond, etc. A bond may also bond lower puck plate 382 and backing plate 384 (bond not shown).

In some embodiments, fasteners are used to couple the puck assembly 356 to the cooling plate 370. For example, threaded inserts and/or heads of threaded fasteners may be disposed in the lower puck plate 322. If threaded inserts are used in the lower puck plate 382, then threaded shafts of threaded fasteners (e.g., bolts) may be inserted through features (e.g., holes) in the cooling plate 370, backing plate 384, lower puck plate 382 and/or base plate 368. If heads of threaded fasteners (e.g., heads of bolts) are disposed in (e.g., encapsulated in) the lower puck plate 382, then the shafts of the fasteners may extend from a bottom of the lower puck plate, through holes in the lower puck plate 382, backing plate 384, base plate 368 and/or cooling plate 370, and nuts may be threaded onto the threaded fasteners to secure the stack of plates together.

In some embodiments, upper puck plate 380 may be composed of an electrically insulating material. Upper puck plate 380 may be composed of ceramic, such as aluminum nitride (AlN) or aluminum oxide ($Al_2O_3$). Lower puck plate 382 and/or backing plate 384 (if used) may be composed of the same material as upper puck plate 380. Lower puck plate 382 and/or backing plate 384 (if used) may be composed of a material with similar thermal expansion properties as the material of upper puck plate 380. Similar thermal expansion of the upper puck plate 380 and lower puck plate 382 (and/or backing plate 384) may cause matching opposite forces to be applied to upper puck plate 380 during thermal expansion and/or contraction events. Approximately matching forces on either side of lower puck plate 380 may minimize deformation, bowing, flexing, or the like of components of substrate support assembly 300B. Approximately matching forces on either side of lower puck plate 382 may reduce or eliminate thermal expansion-induced damage to upper puck plate 380, lower puck plate 382, etc.

In some embodiments, backing plate 384 may be designed to approximately match the thermal expansion properties of upper puck plate 380. Backing plate 384 may be made of a material to approximately match thermal expansion properties of upper puck plate 380. Backing plate 384 may have thermal expansion properties within 1%, 5%, 10%, 20%, etc., of the thermal expansion properties of upper puck plate 380.

In some embodiments, a radio frequency (RF) signal may be provided through puck assembly 356. To facilitate transmission of an RF signal, an RF gasket 396 may be disposed between base plate 368 and lower puck plate 382. The RF gasket 396 may electrically connect base plate 368 to lower puck plate 382. The RF gasket 396 may provide an electrically conductive path bypassing backing plate 384. In some embodiments, a thermal spacer may be disposed adjacent to the RF gasket 396. The thermal spacer (hard stop) may be used to ensure that base plate 368 does not come into contact with lower puck plate 382.

In some embodiments, one or more o-rings 395 are disposed between base plate 368 and lower puck plate 382. The one or more o-rings 395 may include, for example, a single o-ring or a pair of concentric o-rings, which may provide a vacuum seal. In some embodiments, an o-ring 399 is additionally provided between the upper puck plate 380 and base plate 368. The o-ring 399 may be provided to protect the bond 398 in embodiments. The o-ring 399 may be, for example, polyimide, a perfluoropolymer, or another material, such as a plasma resistant material in embodiments.

Substrate support assembly 300B further includes cooling plate 370 and conduits 358. Cooling plate 370 may act as a heat sink, a heat transfer device, a heat exchanger, etc. Conduits 358 may be fluidly connected to a fluid source (not shown). Conduits 358 may facilitate transfer of heat away from puck assembly 356. Cooling plate 370, base plate 368, etc., may share one or more features with analogous assemblies from FIGS. 2 and 3A.

Substrate support assembly 300B includes insulator plate 375. Insulator plate 375 may share one or more features with insulator plate 275 of FIG. 2, and/or insulator plate 325 of FIG. 3A. Insulator plate 375 may include recessed portion 376. Recessed portion 376 may limit contact between base plate 368 and insulator plate 375. Recessed portion 376 may limit heat transfer between base plate 368 and insulator plate 375.

Figure 4:
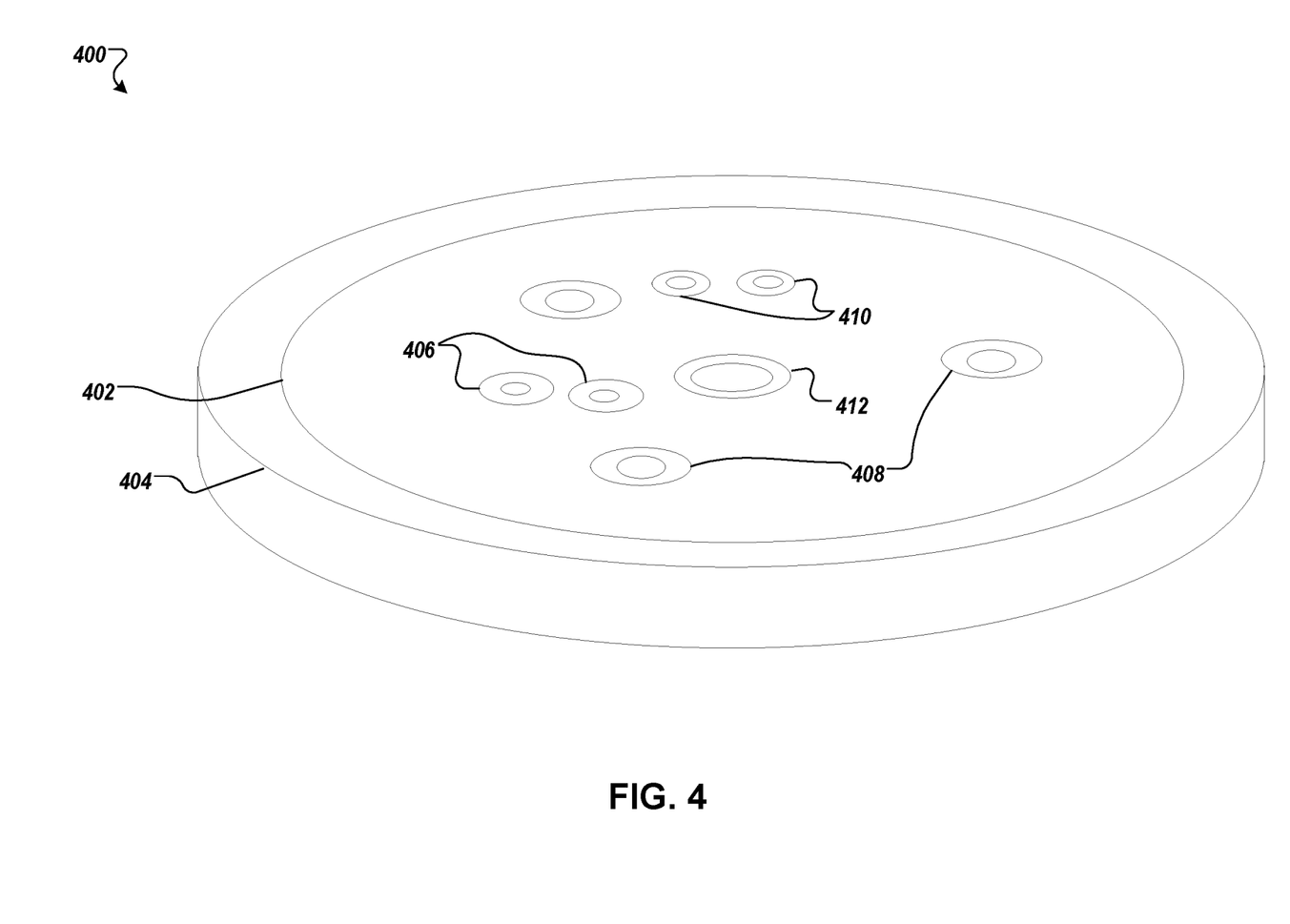
FIG. 4 is a perspective view of an insulator plate including a recessed portion, according to some embodiments.

FIG. 4 is a perspective view of an insulator plate 400 including a recessed portion 402, according to some embodiments. Insulator plate 400 may be of an insulating material, such as plastic, a polymer, etc. Insulator plate 400 may be of a material that insulates against transmission of RF fields. Insulator plate 400 may be an RF insulator plate. In some embodiments, insulator plate 400 may be made of multiple materials. For example, recessed portion 402 may be of a polymer material, and unrecessed portion 404 may be of a ceramic material.

Insulator plate 400 includes a recessed portion 402 and an unrecessed portion 404. The unrecessed portion may be configured to support additional components, such as a base plate of a substrate support assembly. In some embodiments, limited heat transfer to the insulator plate may occur near an outer rim of a substrate support assembly. Recessed portion 402 may be proximate to portions of another component of a substrate support assembly that may reach high temperatures under some conditions, such as EMO conditions. Insulator plate 400 may be disposed proximate a component that may experience elevated temperatures under some conditions, such as EMO conditions. Recessed portion 402 may be protected from high temperatures of an adjacent component by being separated from the component, e.g., by being recessed. Unrecessed portion 404 may be disposed around an outer portion of insulator plate 400, e.g., around the outer edge. Recessed portion 402 may be disposed in a central portion of the insulator plate 400, e.g., surrounded by unrecessed portion 404. Recessed portion 402 and an adjacent component may bound an interior volume, e.g., separating recessed portion 402 from another component. Recessed portion 402 may form an interior volume with a proximate plate structure, such as a cooling plate, base plate, etc. Recessed portion 402 may form an interior volume with a lower plate structure surface of a proximate component. Recessed portion 402 may generate a thermally insulating volume between insulator plate 400 and a proximate component.

Insulator plate 400 may include additional features. Insulator plate 400 may include features for fastening insulator plate 400 to other components of a process chamber, such as bolt holes, etc. (not shown). In some embodiments, unrecessed portion includes a series of holes or other features for securing insulator plate 400 to one or more other components of a process chamber.

Insulator plate 400 may include one or more features of providing access to components disposed on opposite sides of insulate plate 400. Insulator plate 400 may include a number of inserts. Inserts may be of ceramic material, such as alumina. Inserts may extend through insulator plate 400, e.g., from the top surface of recessed portion 402 to the bottom surface of insulator plate 400. Inserts may extend from a surface through a portion of the body of insulator plate 400, e.g., an insert may not extend through the entire thickness of insulator plate 400.

Inserts may enable fluid seals to be made between portions of insulator plate 400 and portions of adjacent components. For example, recessed portion 402 may not be in physical contact with an adjacent component, and an insert may extend beyond the surface of recessed portion 402 to generate a seal with another component, e.g., via an O-ring or gasket. Inserts may provide an access channel to fluidly couple a fluid reservoir to an active fluid zone, e.g., an area where the fluid may be utilized in processing operations.

Inserts may couple a fluid reservoir to a fluid delivery zone. Inserts may couple a cooling fluid reservoir to a cooling plate. Inserts may couple a fluid reservoir to a gas outlet for performing operations such as lift pin operation, providing backing gas, or the like.

Insulator plate 400 includes inserts 406. Inserts 406 may provide a channel for fluid communication, e.g., between a cooling plate and a fluid reservoir. Inserts 406 may facilitate supply and return of coolant. Inserts 406 may form a fluid seal (e.g., via a gasket) with a base plate or other process chamber component.

Insulator plate 400 includes inserts 408. Inserts 408 may provide access to a lift pin assembly, e.g., may provide gas to a lift pin assembly. Inserts 410 may provide access to supply helium to a substrate support surface. Insert 412 may enable electrical access to components of a substrate assembly. Any of these inserts may facilitate fluid seals with adjacent components to insulator plate 400. An insulator plate may include any number of inserts, e.g., in accordance with intended use of the insulator plate. Inserts may be made of various materials, be of various sizes, interface in various ways with adjacent components, etc.

Figure 5:
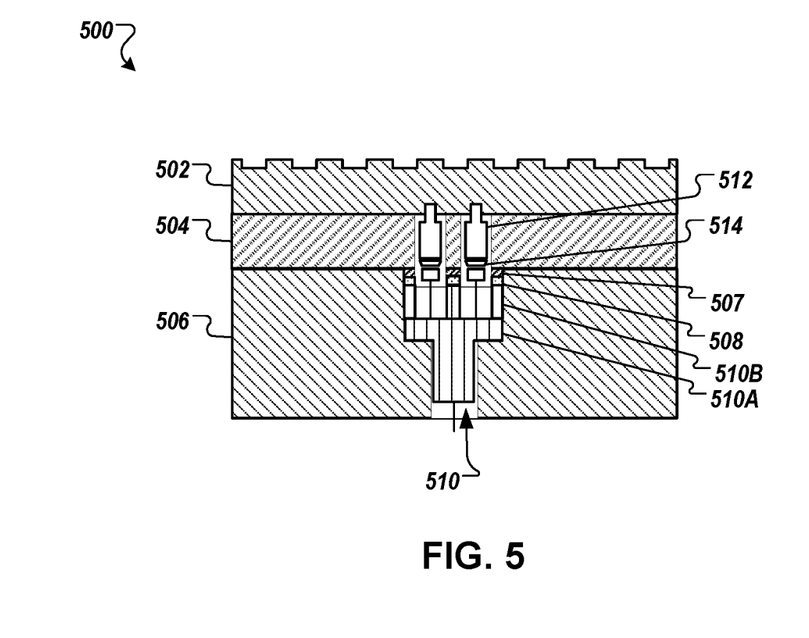
FIG. 5 depicts a diagram of components of a substrate support assembly including high temperature protection, according to some embodiments.

FIG. 5 depicts a schematic diagram of components of an example substrate support assembly 500, including protection from high temperatures, according to some embodiments. Substrate support assembly 500 may include upper puck plate 502, lower puck plate 504, and/or base plate 506. In some embodiments, particular consideration may be taken to protect components of a substrate support assembly from damage due to high temperatures. In some embodiments, as shown in FIG. 5, an insulator 508, an insulator 507 and/or an insulator 510 may be disposed between a substrate support puck and AC power distribution assembly (not shown). Insulator 510 may include a base 510A and a separator 510B mounted to the base 510A. The separator 510B may have a radial fin structure in some embodiments. In some embodiments, insulator 507 is omitted and insulator 508 extends to the lower puck plate 504. Insulator 508 may be of a ceramic material. Insulator 508 may be a ceramic insulator. Insulator 508 may be alumina. Insulator 508 may be a thermoplastic. Insulator 508, may be 1 or more pieces, and may be a mixture of materials in order to achieve the target thermal insulation. Insulator 510 may be a thermoplastic. In some embodiments, an additional insulator (e.g., a layer of thermoplastic) 507 is disposed between insulator 508 and lower puck plate 504. Substrate support assembly 500 may be configured to maintain power distribution assembly and/or insulator 510, insulator 508 and/or insulator 507 below a threshold temperature. In some embodiments, insulator 508, insulator 507 and/or insulator 510 are portions of a single insulator (e.g., insulator 508, insulator 510 and/or thermoplastic 507 may be connected and form a single component, which may be made of thermoplastic. In one embodiment, the single component comprising insulator 508, insulator 507 and insulator 510 includes a ceramic insulator 508 and a thermoplastic insulator 510 and a thermoplastic insulator 507. In one embodiment, a single component comprising thermoplastic insulator 510 and ceramic insulator 508 is used. Insulator 508, insulator 507 and/or insulator 510 may maintain the power distribution assembly below a threshold temperature.

In some embodiments, lower puck plate 504 may be disposed between insulator 508 and upper puck plate 502, e.g., insulator 508 may not be disposed adjacent to upper puck plate 502. Insulator 508 may be disposed to shield sensitive elements such as electrical components from high temperatures of lower puck plate 504.

In some embodiments, one or more terminals 512 (e.g., terminals for supplying power to upper puck plate 502) may extend from upper puck plate 502. Lower puck plate 504 may be shaped to allow terminals 512 to extend from upper puck plate 502 through at least a portion of lower puck plate 504. For example, one or more holes accommodating terminals, connections, screws, washers, wires, or the like, may extend through lower puck plate 504. In some embodiments, insulator 508 includes corresponding holes to accommodate the same components.

Terminals 512 may be electrically connected to AC power distribution assembly 510 via screws. The electrical connections associated with terminals 512 may be protected from loosening (e.g., due to thermal cycling) by one or more mechanical devices. Electrical connections may be protected by including one or more tensioning devices, such as conical washers 514.

Electrical connections to upper puck plate 502 may include further features to restrict transfer of heat to electrical components. Substrate support assembly 500 may include feature to shield components such as AC power distribution assembly 510 from high temperatures. Some portion of an electrical path between upper puck plate 502 and AC power distribution assembly 510 may include wires, which may reduce heat flow through the electrical components. The wire paths may be extended and/or convoluted, which may further limit heat flow to AC power distribution assembly 510. A length of a wire path may be extended (e.g., beyond the length necessary to achieve electrical coupling) to achieve a target heat transfer rate.

Unless specifically stated otherwise, terms such as "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose system selectively configured to perform methods described herein.

The terms "over," "under," "between," "disposed on," "support," and "on" as used herein refer to a relative position of one material layer or component with respect to other layers or components. For example, one layer disposed on, over, or under another layer may be directly in contact with the other layer or may have one or more intervening layers. Moreover, one layer disposed between two layers may be directly in contact with the two layers or may have one or more intervening layers. Similarly, unless explicitly stated otherwise, one feature disposed between two features may be in direct contact with the adjacent features or may have one or more intervening layers.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A substrate support assembly, comprising:
    a plate structure comprising an upper plate and a lower plate, the lower plate comprising a lower plate structure surface; and an insulator structure, comprising a radio frequency insulator, disposed beneath the plate structure, the insulator structure comprising:
a lower insulator structure surface; and
an upper insulator structure surface, wherein a first portion of the upper insulator structure surface is recessed with respect to a second portion of the upper insulator structure surface, and wherein the first portion of the upper insulator structure surface forms an interior volume with the lower plate structure surface; and
an insert, wherein the insert extends from the first portion of the upper insulator structure surface, through the interior volume, to the lower plate structure surface, and provides a fluid path for fluid to flow between the plate structure and the insulator structure.

2. The substrate support assembly of claim 1, wherein the upper plate comprises a cooling plate, wherein the cooling plate is configured to have a coolant circulated through one or more channels of the cooling plate.

3. The substrate support assembly of claim 1, wherein the second portion of the upper insulator structure surface forms a seal with the lower plate structure surface.

4. The substrate support assembly of claim 1, wherein a top surface of the insert forms a seal with the lower plate structure surface.

5. The substrate support assembly of claim 1, wherein the insert provides a channel to fluidly couple a fluid reservoir to a fluid delivery zone, wherein the fluid reservoir is coupled to a first side of the insert and the fluid delivery zone is fluidly coupled to a second side of the insert.

6. The substrate support assembly of claim 1, wherein the insulator structure comprises a) a cross-linked polymer comprising polystyrene or b) a polyamideimide.

7. The substrate support assembly of claim 1, wherein a first surface area of the first portion of the upper insulator structure surface is greater than a second surface area of the second portion of the upper insulator structure surface such that an area of the insulator structure making a contact with respect to the lower plate structure surface is less than an area of the insulator structure not making contact with respect to the lower plate structure surface.

8. The substrate support assembly of claim 1, further comprising a puck for supporting a substrate, a power delivery system for electrically coupling one or more components of the puck to a power supply, and an insulator comprising at least one of alumina or a thermoplastic disposed between the puck and the power delivery system.

9. An insulator structure of a substrate support assembly, comprising:
a lower insulator structure surface;
an upper insulator structure surface, wherein a first portion of the upper insulator structure surface is recessed with respect to a second portion of the upper insulator structure surface; and
a first insert, wherein the first insert extends from the first portion of the upper insulator structure surface, and wherein the first insert provides a fluid flow path from within the insulator structure to beyond the upper insulator structure surface.

10. The insulator structure of claim 9, wherein the second portion of the upper insulator structure surface is disposed along an outer portion of the upper insulator structure surface, and the first portion of the upper insulator structure surface is disposed proximate a central portion of the upper insulator structure surface.

11. The insulator structure of claim 9, further comprising a fluidly sealing component disposed on the second portion of the upper insulator structure surface.

12. The insulator structure of claim 9, further comprising a second insert, wherein the second insert extends from the lower insulator structure surface to the upper insulator structure surface, and wherein the second insert extends through the first portion of the upper insulator structure surface.

13. The insulator structure of claim 12, wherein the second insert fluidly couples a fluid reservoir to a fluid delivery zone.

14. The insulator structure of claim 12, further comprising a third insert, wherein the second insert fluidly couples a reservoir of cooling fluid to a portion of the substrate support assembly, and wherein the third insert fluidly couples a reservoir of gas to a gas outlet for performing an operation associated with substrate processing.

15. A process chamber, comprising a substrate support assembly, the substrate support assembly comprising:
a puck for supporting a substrate, the puck comprising a heating element; and
a radio frequency (RF) insulator structure, wherein the RF insulator structure comprises:
a lower insulator structure surface;
an upper insulator structure surface, wherein a first portion of the upper insulator structure surface is recessed with respect to a second portion of the upper insulator structure surface; and
an insert, wherein the insert extends from the first portion of the upper insulator structure surface, and wherein the insert provides a fluid flow path from within the insulator structure to beyond the upper insulator structure surface.

16. The process chamber of claim 15, wherein the insulator structure comprises a polyamideimide or a cross-linked polymer comprising polystyrene.

17. The process chamber of claim 15, further comprising a plate structure comprising a lower plate structure surface disposed above the insulator structure, wherein the first portion of the upper insulator structure surface bounds an interior volume with the lower plate structure surface.

18. The process chamber of claim 17, wherein the second portion of the upper insulator structure surface forms a seal with the lower plate structure surface.

* * * * *